(12) United States Patent
Kajiyama

(10) Patent No.: US 10,217,808 B2
(45) Date of Patent: Feb. 26, 2019

(54) DISPLAY DEVICE

(71) Applicant: Japan Display Inc., Minato-ku (JP)

(72) Inventor: Kenta Kajiyama, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/804,075

(22) Filed: Nov. 6, 2017

(65) Prior Publication Data

US 2018/0138260 A1 May 17, 2018

(30) Foreign Application Priority Data

Nov. 16, 2016 (JP) ................................. 2016-223266

(51) Int. Cl.
| | |
|---|---|
| *H01L 27/32* | (2006.01) |
| *H01L 25/18* | (2006.01) |
| *H01L 51/00* | (2006.01) |
| H01L 27/12 | (2006.01) |
| H01L 51/52 | (2006.01) |
| H01L 23/498 | (2006.01) |

(52) U.S. Cl.
CPC .......... *H01L 27/3276* (2013.01); *H01L 25/18* (2013.01); *H01L 27/3248* (2013.01); *H01L 27/3258* (2013.01); *H01L 51/0096* (2013.01); *H01L 23/4985* (2013.01); *H01L 27/124* (2013.01); *H01L 27/1218* (2013.01); *H01L 27/3262* (2013.01); *H01L 51/5253* (2013.01)

(58) Field of Classification Search
CPC . H01L 27/3276; H01L 27/32; H01L 27/3248; H01L 27/3258; H01L 25/18; H01L 51/0096
See application file for complete search history.

(56) References Cited

U.S. PATENT DOCUMENTS

2015/0187807 A1* 7/2015 Tsuruoka .............. H01L 27/124
257/347

FOREIGN PATENT DOCUMENTS

JP 2016-31499 3/2016

* cited by examiner

*Primary Examiner* — Fazli Erdem
(74) *Attorney, Agent, or Firm* — Oblon, McClelland, Maier & Neustadt, L.L.P.

(57) ABSTRACT

A display device according to an embodiment of the present invention include: an insulating base material, a metal layer that is provided inside the insulating base material, and is electrically connected to an electric power supply, an insulating layer that is provided over the insulating base material, a display element that is provided over the insulating layer, a driver integrated circuit that is provided over the insulating layer, a signal line that is provided over the insulating layer, and connects the display element and the driver integrated circuit to each other, and a through hole that electrically connects the display element and the metal layer to each other.

7 Claims, 8 Drawing Sheets

DISPLAY DEVICE

CROSS-REFERENCE TO RELATED APPLICATION

The present application claims priority from Japanese Application JP 2016-223266 filed on Nov. 16, 2016, the content of which is hereby incorporated by reference into this application.

BACKGROUND OF THE INVENTION

1. Field of the Invention

One or more embodiments of the present invention relate to a display device.

2. Description of the Related Art

A conventional display device includes, as disclosed in Japanese Patent Application Laid-Open No. 2016-031499, an insulating base material, a wiring layer provided on the insulating base material, a display element provided on the wiring layer and a driver IC (Integrated Circuit). The wiring layer includes an insulating layer, various types of wirings provided in the insulating layer, and some electrical components. The display element and the driver IC are electrically connected to each other by a signal line provided in the wiring layer. Further, on an upper surface of the wiring layer, an electric power supply line that supplies electric power to the display element is provided so as to pass through between the display element and the driver IC.

SUMMARY OF THE INVENTION

However, in the conventional display device, a part is generated where the electric power supply line disposed on the wiring layer, and the signal line disposed in the wiring layer intersect with each other with an arrangement of the insulating layer therebetween. Therefore, a capacitance is generated at this intersection part, which possibly generates a delay of a signal transmission in the signal line.

The present disclosure has been made in view of the above problem, and the object thereof is to suppress the generation of the delay of the signal transmission in the signal line of the display device.

A display device according to an embodiment of the present invention includes: an insulating base material, a metal layer that is provided inside the insulating base material, and is electrically connected to an electric power supply, an insulating layer that is provided over the insulating base material, a display element that is provided over the insulating layer, a driver integrated circuit that is provided over the insulating layer, a signal line that is provided over the insulating layer, and connects the display element and the driver integrated circuit to each other, and a through hole that electrically connects the display element and the metal layer to each other.

In one embodiment of the present invention, the insulating base material comprises a first insulating base material, and a second insulating base material that is provided over the first insulating base material, the metal layer is provided between the first insulating base material and the second insulating base material, a wiring connection part of the metal layer is exposed by a hole of the first insulating base material, and the wiring connection part is connected to the electric power supply via a flexible circuit substrate.

In one embodiment of the present invention, the display element includes: a wiring is connected to the metal layer via the through hole, a driving thin film transistor that is electrically connected to the wiring, and an organic electroluminescence layer that is electrically connected to the driving thin film transistor.

In one embodiment of the present invention, the insulating layer comprises a first insulating layer, and a second insulating layer that is provided over the first insulating layer, and a part of the second insulating layer functions as a part of the driving thin film transistor that is included in the display element.

In one embodiment of the present invention, the display element comprises a sampling thin film transistor that is electrically connected to the signal line.

In one embodiment of the present invention, the insulating layer comprises a first insulating layer, and a second insulating layer that is provided over the first insulating layer, and a part of the second insulating layer functions as a part of the sampling thin film transistor that is included in the display element.

In one embodiment of the present invention, a relative permittivity of the insulating base material is lower than a relative permittivity of the insulating layer.

DETAILED DESCRIPTION OF THE INVENTION

First Embodiment

Figure 1:
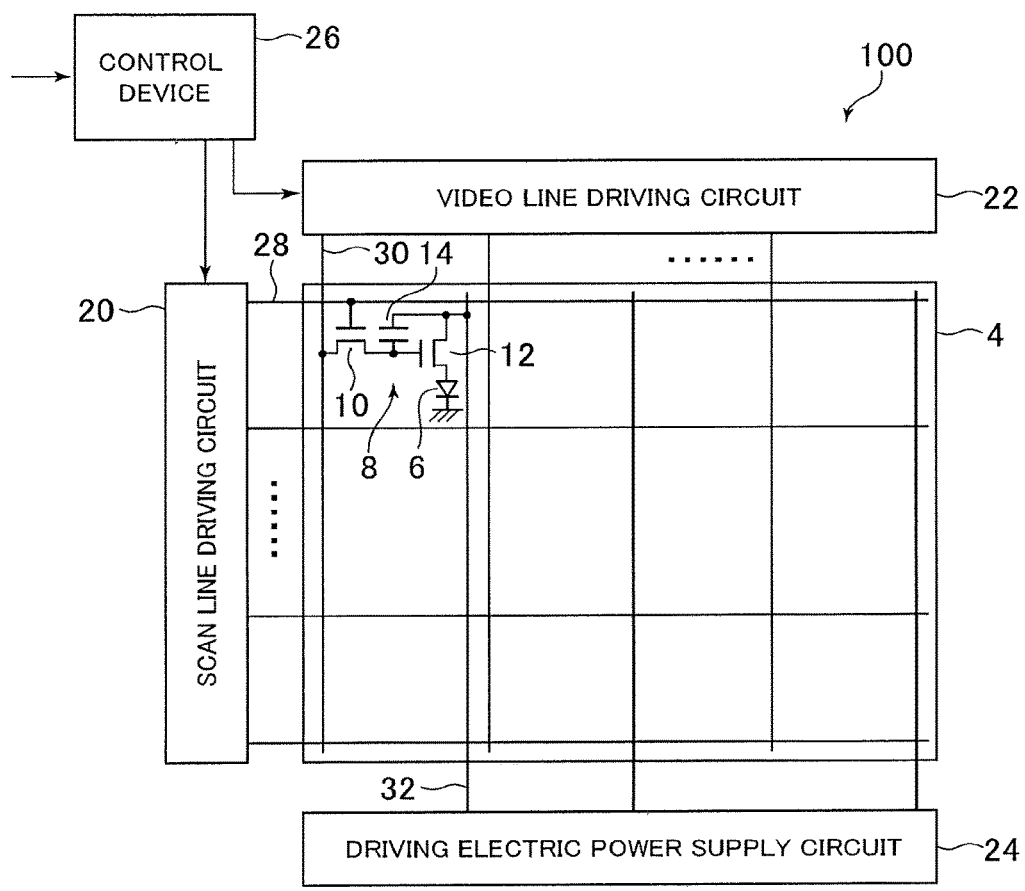
FIG. 1 is a schematic diagram that illustrates a schematic configuration of a display device according to a present embodiment.

Below, an embodiment of the present disclosure is explained based on the accompanying drawings.

Note that the present disclosure is merely an example, and an appropriate variation that a person skilled in the art can easily arrive at without departing from the spirit of the present invention is naturally included in the scope of the present invention. Further, while the width, thickness, shape, and the like of each part in the drawings may be illustrated schematically as compared with the actual embodiments in order to clarify the explanation, these are merely examples, and an interpretation of the present invention should not be limited thereto. Furthermore, in the specification and the respective drawings, the same reference symbols may be applied to elements similar to those that have already been illustrated in another drawing, and a detailed explanation of such elements may be omitted as appropriate.

A display device 100 according to the embodiment of the present disclosure is, for example, an organic electroluminescence display device, and is provided in a television, a personal computer, a mobile terminal, a cellular phone, and the like. FIG. 1 is a schematic diagram that schematically illustrates the configuration of the display device 100 according to the embodiment. The display device 100 is provided with a pixel array part 4 to display an image, and a driving part to drive the pixel array part 4.

On the pixel array part 4, an organic light emitting diode 6 and a pixel circuit 8 are arranged in a matrix in correspondence to each pixel. The pixel circuit 8 includes a sampling TFT 10 (thin film transistor) 10, a driving TFT 12, a capacitor 14, and the like.

Whereas, the driving part includes a scan line driving circuit 20, a video line driving circuit 22, a driving electric power supply circuit 24, and a control device 26, drives the pixel circuit 8, and controls a light emission of the organic light emitting diode 6.

The scan line driving circuit 20 is connected to a scan line 28 provided for each horizontal sequence of pixels (pixel row). The scan line driving circuit 20 selects scan lines 28 in order in accordance with timing signals input from the control device 26, and applies an electric voltage for turning on the sampling TFT 10 to the selected scan line 28.

The video line driving circuit 22 is connected to a signal line 30 provided for each vertical sequence of pixels (a pixel column). The control device 26 inputs a video signal to the video line driving circuit 22, and the video line driving circuit 22 outputs an electric voltage corresponding to a video signal of the selected pixel row, in accordance with the selection of the scan line 28 by the scan line driving circuit 20, to the respective signal lines 30. The electric voltage is written into the capacitor 14 in the selected pixel row via the sampling TFT 10. The driving TFT 12 supplies an electric current corresponding to the written voltage to the organic light emitting diode 6, whereby the organic light emitting diode 6 of the pixel that corresponds to the selected scan line 28 emits light.

The driving electric power supply circuit 24 is connected to the electric power supply line 32 provided for each pixel column, and supplies an electric current to the organic light emitting diode 6 via the electric power supply line 32 and the driving TFT 12 of the selected pixel row.

Here, a lower electrode of the organic light emitting diode 6 is connected to the driving TFT 12. Whereas, an upper electrode of each organic light emitting diode 6 is constituted by an electrode commonly shared by the organic light emitting diodes 6 of all the pixels. If the lower electrode is configured as an anode, a high electric potential is input thereto, and the upper electrode becomes a cathode, to which a low electric potential is input. If the lower electrode is configured as the cathode, a low electric potential is input thereto, and the upper electrode becomes the anode, to which a high electric potential is input.

Figure 2:
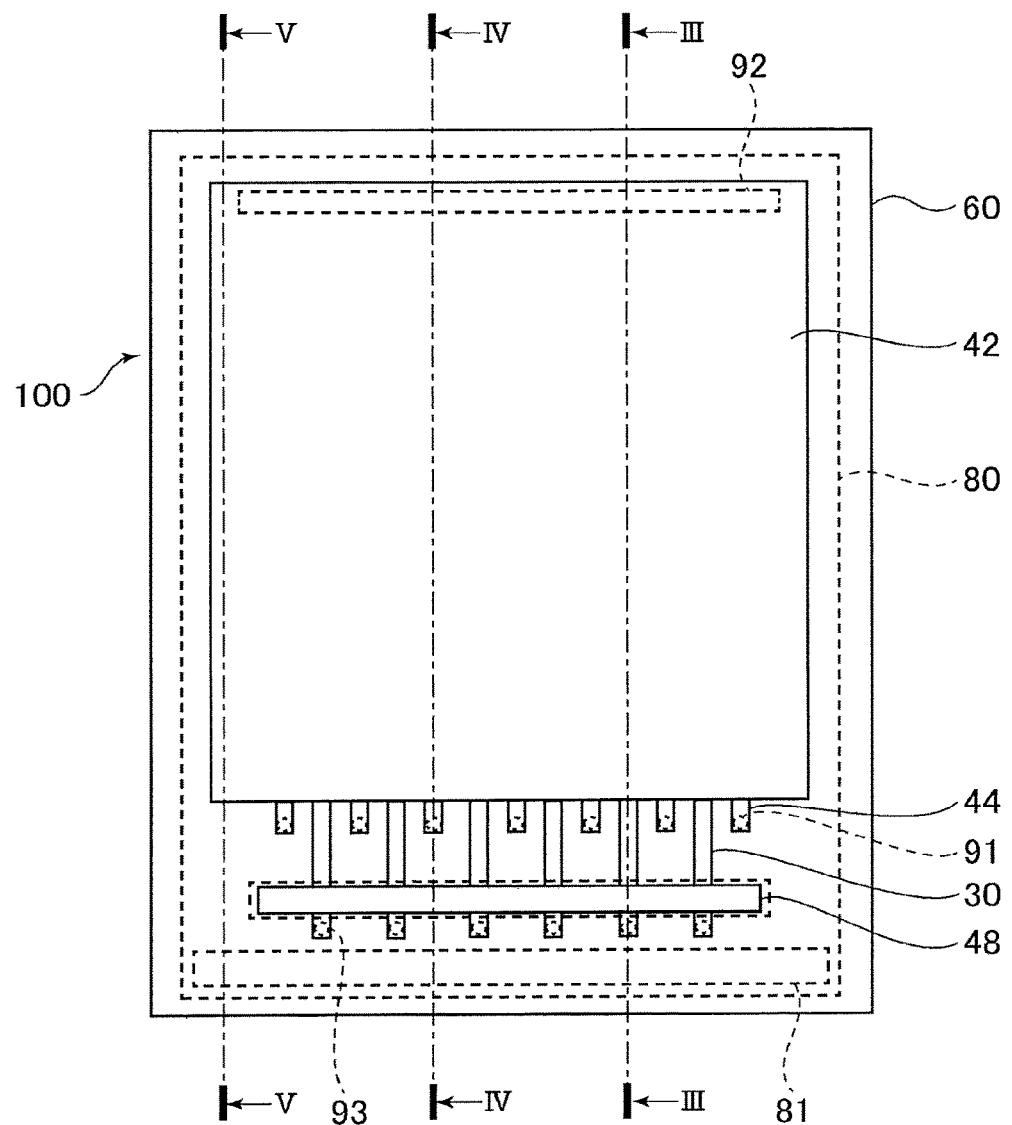
FIG. 2 is a schematic planar diagram of the display device according to the present embodiment.

FIG. 2 is a schematic planar diagram of the display device 100. The display device 100 includes an insulating base material, and an insulating layer 60 provided over this insulating base material. Over the insulating layer 60, a display element 42 and a driver IC (integrated circuit) 48 are disposed, and the display element 42 and the driver IC 48 are electrically connected to each other by the signal line 30.

Figure 3:
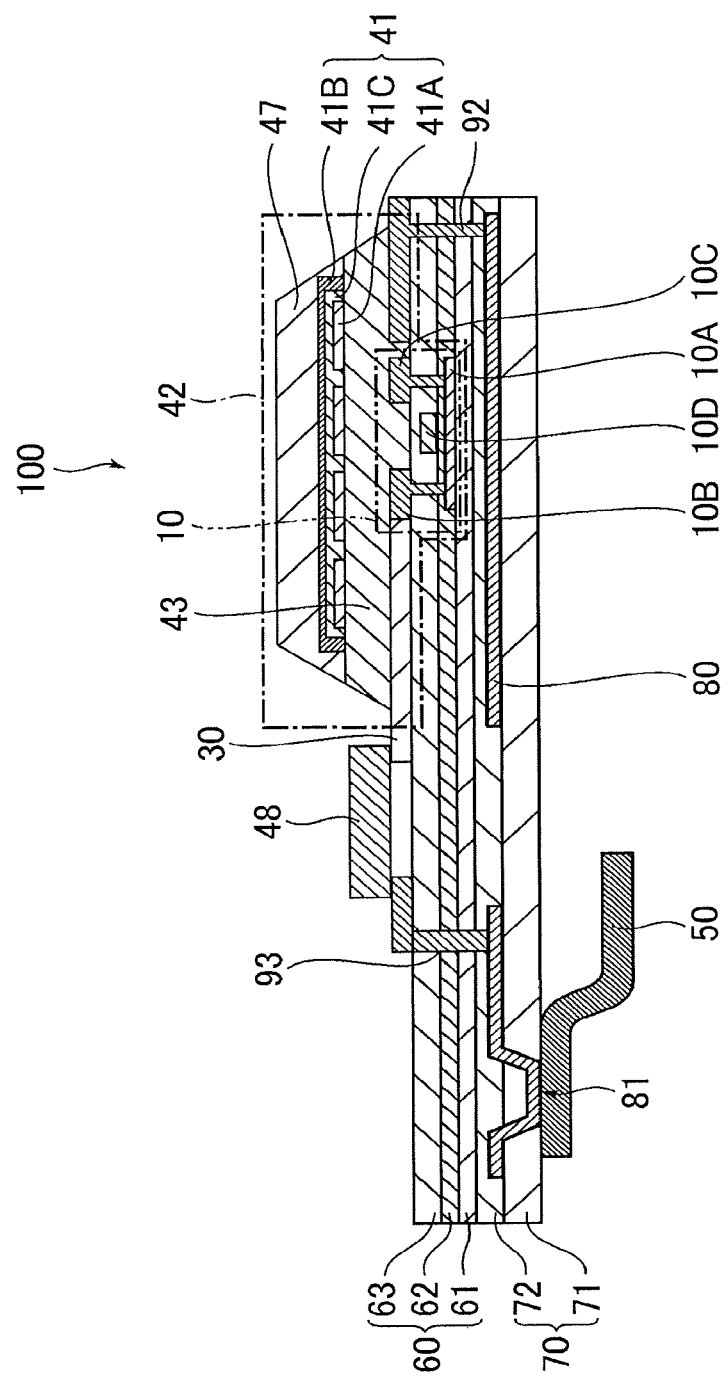
FIG. 3 is a schematic vertical cross sectional diagram of the display device according to the present embodiment.

FIG. 3 is a cross sectional diagram that illustrates a cross section at the position of line of FIG. 2. In the present embodiment, as illustrated in FIG. 3, an insulating base material 70 is formed by using, for example, polyimide, and includes a first insulating base material 71, and a second insulating base material 72 provided on an upper surface of the first insulating base material 71. Note that the insulating base material 70 may be composed only of a single layer, and may also be composed of two or more layers. Further, as a material that constitutes the insulating base material 70, an insulating material other than polyimide may be used.

An insulating layer 60 constituted by, for example, silicon nitride, silicon oxide, and the like is disposed on an upper surface of the insulating base material 70. In the present embodiment, the insulating layer 60 includes a first insulating layer 61, a second insulating layer 62 provided on an upper surface of the first insulating layer 61, and a third insulating layer 63 provided on an upper surface of the second insulating layer 62. A part of the second insulating layer 62 functions as a gate insulating layer of the sampling TFT 10. The third insulating layer 63 protects a gate electrode layer 10D of the sampling TFT 10. Note that the insulating layer 60 may be composed only of a single layer, and may also be composed of two or more layers. Further, as a material that constitutes the insulating layer 60, an insulating material other than silicon nitride and silicon oxide may be used. In the present embodiment, the first insulating layer 61 has a lamination structure of a silicon oxide layer and a silicon nitride layer, as a material that constitutes the second insulating layer 62 silicon nitride is used, and as a material that constitutes the third insulating layer 63 silicon nitride or silicon oxide is used.

On an upper surface of the insulating layer 60, the display element 42, the driver IC 48, and the like are disposed, and the sampling TFT 10 and the driver IC 48 in the display element 42 are electrically connected to each other by the signal line 30. The sampling TFT 10 includes a semiconductor layer 10A provided on an upper surface of the first insulating layer 61, the gate electrode 10D provided on an upper surface of the second insulating layer 62, and a source electrode 10B and the drain electrode 10C that are connected to the semiconductor layer 10A by penetrating through the third insulating layer 63 and the second insulating layer 62 starting from an upper surface of the third insulating layer 63.

The display element 42 includes the pixel array part 4 illustrated in FIG. 1, the organic light emitting diode 6, and the pixel circuit 8. The organic light emitting diode 6 in each pixel is constituted by an anode 41A disposed in each pixel, a cathode 41B provided so as to be commonly shared by all of the pixels, and an organic layer 41C provided between the anode 41A and the cathode 41B. The anodes 41A, the cathodes 41B, and the organic layers 41C that correspond to all of the pixels constitute the organic EL (Electroluminescence) layer 41. The display element 42 includes a planarizing film 43 under the anode 41A, and due to the existence of this planarizing film 43, regardless of whether or not there are various kinds of wirings between the anode 41A and the insulating layer 60, a configuration is realized where the anodes 41A of the respective pixels are arranged with no elevation difference. Upper and lateral surfaces of the organic EL layer 41 is sealed by a sealing film 47.

Between the first insulating base material 71 and the second insulating base material 72, a metal layer 80 is disposed, and thus it is configured that the metal layer 80 exists inside the insulating base material 70. At a lower surface of the insulating base material 70 (i.e., a lower surface of the first insulating base material 71 in the present embodiment), a hole is formed, and a wiring connection part 81 of the metal layer 80 is not covered by the first insulating base material 71 at this hole.

The metal layer 80 is electrically connected to a through hole 93. The through hole 93 penetrates the insulating layer 60 and the second insulating base material 72, and electrically connects the driver IC 48 and the metal layer 80 to each other. The metal layer 80 is connected to a flexible circuit substrate 50, receives a video signal from the flexible circuit substrate 50, and inputs the video signal to the driver IC 48 via the through hole 93. The driver IC 48 generates an image signal by applying a digital/analog conversion to the video signal, and inputs the image signal to the signal line 30. Note that an electric power supply to drive the driver IC 48, a control signal to control the driver IC 48, and the like are supplied from the flexible circuit substrate 50 via the through hole 93 and the metal layer 80.

Figure 4:
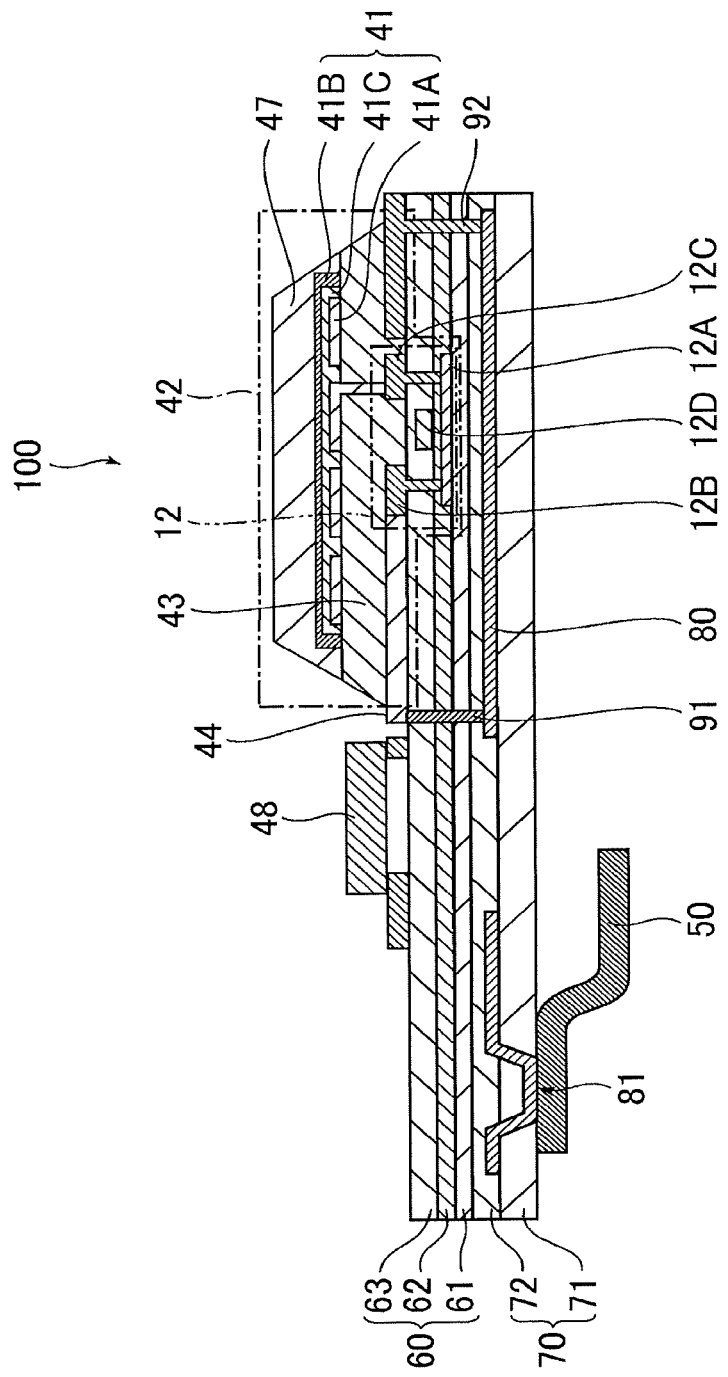
FIG. 4 is a schematic vertical cross sectional diagram of the display device according to the present embodiment.
Figure 5:
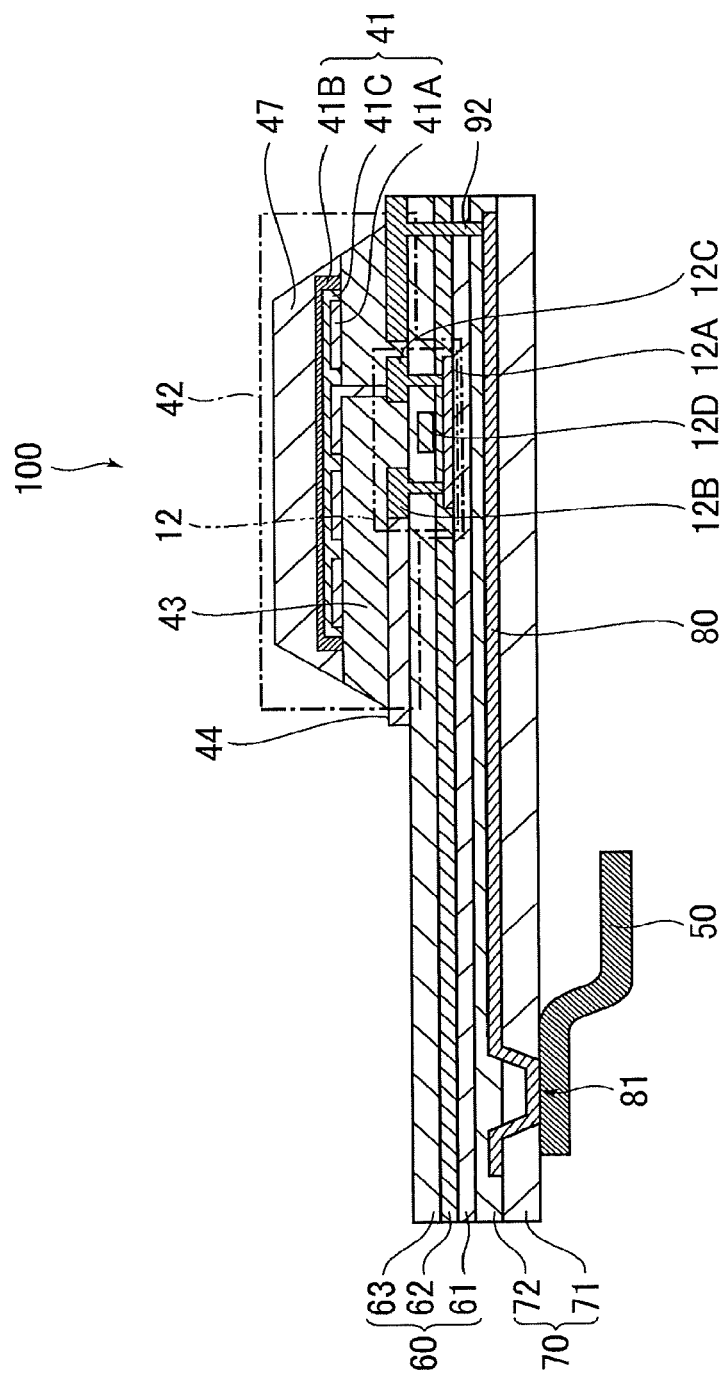
FIG. 5 is a schematic vertical cross sectional diagram of the display device according to the present embodiment.

FIG. 4 is a cross sectional diagram that illustrates a cross section at the position of line IV-IV of FIG. 2, and FIG. 5 is a cross sectional diagram that illustrates a cross section at the position of line V-V of FIG. 2. As illustrated in FIGS. 4 and 5, the display element 42 has the driving TFT 12, and the driving TFT 12 is connected to the anode 41A of the organic EL layer 41. A part of the second insulating layer 62 functions as a gate insulating film of the driving TFT 12. The third insulating layer 63 protects the gate electrode 12D of the driving TFT 12. The driving TFT 12 includes a semiconductor layer 12A provided on an upper surface of the first insulating layer 61, the gate electrode 12D provided on an upper surface of the second insulating layer 62, and a source electrode 12B and a drain electrode 12C connected to the semiconductor layer 12A by penetrating the third insulating layer 63 and the second insulating layer 62, starting from an upper surface of the third insulating layer 63.

As illustrated in FIG. 4, the display element 42 has, in an edge part area of the display element 42, the wiring 44 connected to the driving TFT 12, and a through hole 91 is electrically connected to the wiring 44. The through hole 91 penetrates the insulating layer 60 and the second insulating base material 72, and is electrically connected to the metal layer 80 disposed under the display element 42. The metal layer 80 is connected to the flexible circuit substrate 50 at the wiring connection part 81 as described above, and electric power is supplied to some pixels in the display element 42 from the flexible circuit substrate 50 that is connected to the electric power supply, via the metal layer 80, the through hole 91, and the wiring 44.

Further, as illustrated in FIGS. 4 and 5, in the present embodiment, a through hole 92 is provided in another edge part area of the display element 42, and electric power is supplied to the other pixels in the display element 42 from the flexible circuit substrate 50, via the metal layer 80 and the through hole 92.

The metal layer 80, the through hole 91, and the through hole 92 as above constitute the electric power supply line 32 illustrated in FIG. 1.

According to such a configuration, an arrangement can be realized where the signal line 30 for connecting the driver IC 48 and the display element 42 to each other is disposed on an upper surface side of the insulating layer 60, and at the same time the metal layer 80 that is a part of the electric power supply line 32 to supply electric power to the display element 42 is disposed inside the insulating base material 70 disposed under the insulating layer 60. As a result, between the signal line 30 and the metal layer 80, at least the insulating layer 60 and a part of the insulating base material 70 (i.e., the second insulating base material 72 in the present embodiment) are interposed. Therefore, a value of a capacitance that is generated between the signal line 30 and the metal layer 80 can be made small, and a generation of delay of a signal transmission in the signal line 30 can be suppressed.

Further, if something with a relative permittivity smaller than that of a material constituting the insulating layer 60 is adopted as a material that constitutes the insulating base material 70, an effect of suppressing the capacitance generation by interposing the insulating base material 70 between the signal line 30 and the metal layer 80 can be improved. For example, in a case where silicon nitride with the relative permittivity of 7.5 and silicon oxide with the relative permittivity of 3.9 are used as the insulating layer 60, and as a result the relative permittivity of the insulating layer 60 as a whole gets larger than 4.8, by using polyimide with the relative permittivity of 4.8 as the insulating base material 70 to thereby interpose this insulating base material 70 with the low relative permittivity between the signal line 30 and the metal layer 80, the effect of suppressing the capacitance generation can be improved.

In the present embodiment, it is configured to have the part of the second insulating film 62 function as a gate insulating film of the sampling TFT 10 or driving TFT 12 included in the pixel circuit 8 included in the display element 42. According to such a configuration, a thinned the display element 42 can be realized. Further, even if the part of the second insulating film 62 is configured to function as the gate insulating film of the sampling TFT 10 or driving TFT 12, the first insulating layer 61 and the second insulating base material 72 can be interposed between the metal layer 80 and the sampling TFT 10/driving TFT 12, and therefore an unintended generation of a capacitance between the metal layer 80 and the sampling TFT 10/driving TFT 12 can be suppressed.

Figure 6:
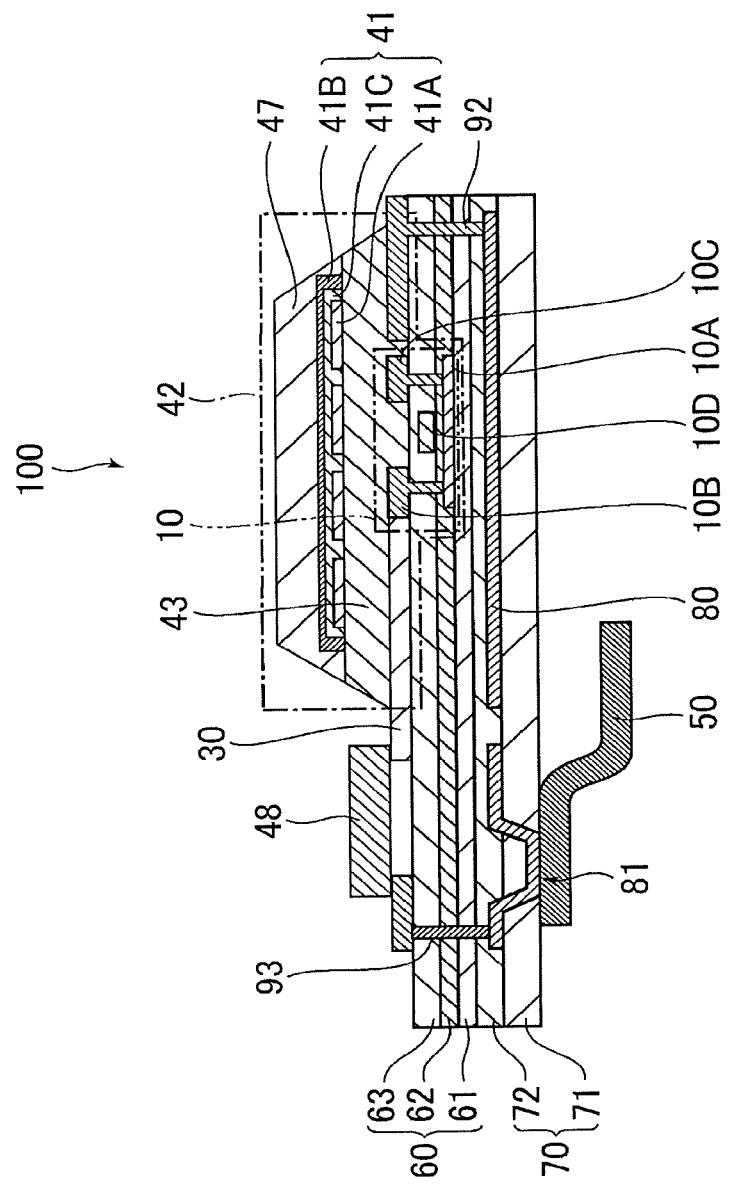
FIG. 6 is a schematic vertical cross sectional diagram of a variation of the display device according to the present embodiment.
Figure 7:
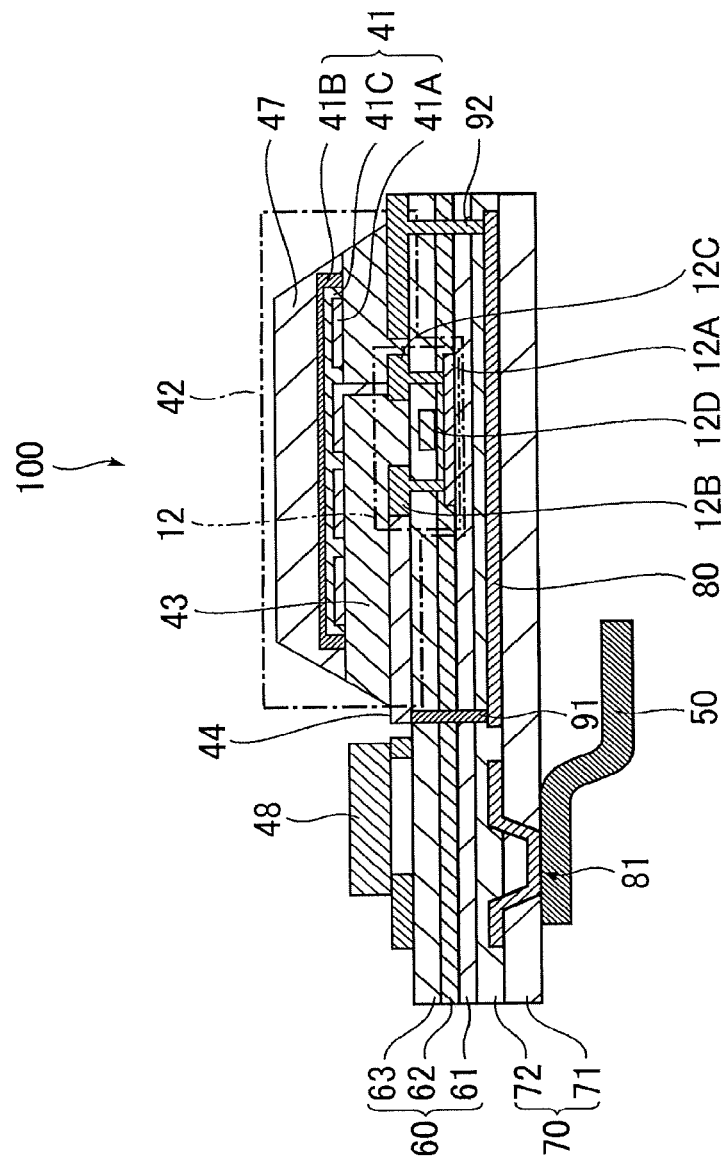
FIG. 7 is a schematic vertical cross sectional diagram of the variation of the display device according to the present embodiment.
Figure 8:
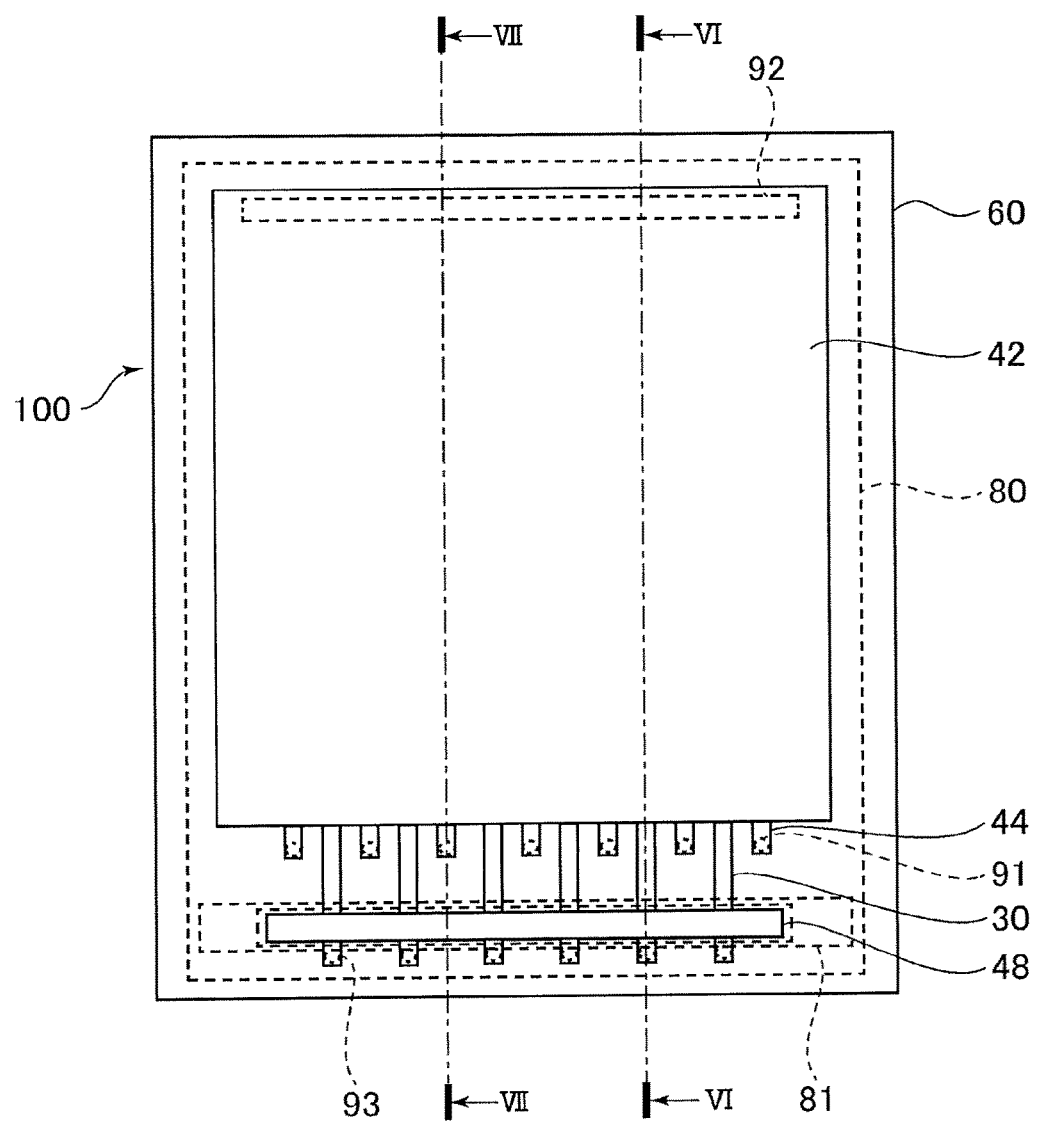
FIG. 8 is a schematic planar diagram of the variation of the display device according to the present embodiment.

FIG. 8 is a planar diagram that illustrates a variation of the display device 100 according to the present embodiment, and FIGS. 6 and 7 are cross sectional diagrams that illustrates the variation of the display device 100 according to the present embodiment. FIG. 6 illustrates a cross section at the position of line VI-VI in FIG. 8, and FIG. 7 illustrates a cross section at the position of line VII-VII in FIG. 8. In the variation illustrated in FIGS. 6, 7, and 8, the wring connection part 81 is disposed under the driver IC, and it is arranged such that the driver IC 48 and the wiring connection part 81 overlap in a planar view. According to such an arrangement, it can be realized to downsize a mounting area where the driver IC 48 and the like are disposed.

While there have been described what are at present considered to be certain embodiments of the invention, it will be understood that various modifications may be made thereto, and it is intended that the appended claims cover all such modifications as fall within the true spirit and scope of the invention.

What is claimed is:
1. A display device comprising:
an insulating base material;
a metal layer that is provided inside the insulating base material, and is electrically connected to an electric power supply;
an insulating layer that is provided over the insulating base material;
pixels arranged in a matrix form on the insulating layer, each of the pixels including an organic light emitting diode and a pixel circuit connected to the organic light emitting diode;

a power supply line which is arranged on the insulating layer and is connected to the pixels;

a driver integrated circuit connected to the pixels on the insulating layer;

a first through hole which is arranged in the insulating layer and electrically connects the power supply line and the metal layer to each other; and second through holes which are arranged in the insulating layer and electrically connect the pixels and the metal layer to each other, wherein the metal layer is arranged directly below the pixels and the power supply line, wherein the metal layer continuously surrounds a pixel array including the pixels in a planar view, and wherein the power supply line, the pixels, the second through holes, and the driver integrated circuit are arranged in sequential order.

2. The display device according to claim 1, wherein the insulating base material comprises a first insulating base material, and a second insulating base material that is provided over the first insulating base material, wherein the metal layer is provided between the first insulating base material and the second insulating base material, wherein a wiring connection part of the metal layer is exposed by a hole of the first insulating base material, and wherein the wiring connection part is connected to the electric power supply via a flexible circuit substrate.

3. The display device according to claim 1, further comprising:

third through holes which are arranged in the insulating layer and electrically connect the drive integrated circuit and the metal layer to each other.

4. The display device according to claim 2, wherein the driver integrated circuit overlaps the wiring connection part of the metal layer in a planar view.

5. The display device according to claim 1, wherein the first through hole, the pixels, the second through holes, and the driver integrated circuit are arranged in sequential order.

6. The display device according to claim 4, wherein the insulating base material and the insulating layer are sandwiched by the flexible circuit substrate and the drive integrated circuit.

7. The display device according to claim 1, wherein a relative permittivity of the insulating base material is lower than a relative permittivity of the insulating layer.

* * * * *